(12) United States Patent
Muralimanohar et al.

(10) Patent No.: US 10,698,975 B2
(45) Date of Patent: Jun. 30, 2020

(54) IN SITU TRANSPOSITION (71) Applicant: Hewlett Packard Enterprise Development LP, Houston, TX (US)

(72) Inventors: Naveen Muralimanohar, Santa Clara, CA (US); Benjamin Feinberg, Palo Alto, CA (US); John Paul Strachan, San Carlos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 64 days.

(21) Appl. No.: 16/063,793

(22) PCT Filed: Jan. 27, 2016

(86) PCT No.: PCT/US2016/015060
§ 371 (c)(1),
(2) Date: Jun. 19, 2018

(87) PCT Pub. No.: WO2017/131653
PCT Pub. Date: Aug. 3, 2017

(65) Prior Publication Data
US 2019/0236111 A1    Aug. 1, 2019

(51) Int. Cl.
*G06F 17/16* (2006.01)
*G11C 13/00* (2006.01)
(Continued)

(52) U.S. Cl.
CPC ............... *G06F 17/16* (2013.01); *G06G 7/16* (2013.01); *G11C 7/16* (2013.01); *G11C 13/0002* (2013.01); *G11C 13/0007* (2013.01); *G11C 13/0026* (2013.01); *G11C 13/0028* (2013.01); *G11C 13/0069* (2013.01)

(58) Field of Classification Search
None
See application file for complete search history.

(56) References Cited

U.S. PATENT DOCUMENTS 6,624,773 B2    9/2003   Wong
7,031,994 B2 *  4/2006   Lao ..................... G06F 7/785
                                                      708/400

(Continued)

OTHER PUBLICATIONS

Bekiaris, D. et al., "A High-Speed Radix-4 Multiplexer-Based Array Multiplier", (Research Paper), Proceedings of the 18th ACM Great Lakes symposium on VLSI, 2008, pp. 115-118.

(Continued)

*Primary Examiner* — Michael D. Yaary
(74) *Attorney, Agent, or Firm* — Hewlett Packard Enterprise Patent Department (57) ABSTRACT

Example implementations of the present disclosure relate to in situ transposition of the data values in a memory array. An example system may include a non-volatile memory (NVM) array, including a plurality of NVM elements, usable in performance of computations. The example system may include an input engine to input a plurality of data values for storage by a corresponding plurality of original NVM elements. The example system may further include a transposition engine to direct performance of the in situ transposition such that the plurality of data values remains stored by the original NVM elements.

15 Claims, 5 Drawing Sheets

(51) Int. Cl.
    *G06G 7/16*     (2006.01)
    *G11C 7/16*     (2006.01)

(56) References Cited

U.S. PATENT DOCUMENTS

| | | |
|---|---|---|
| 8,539,016 B1 | 9/2013 | Langhammer |
| 8,959,136 B1 | 2/2015 | Cheung et al. |
| 2002/0196647 A1 | 12/2002 | Nickel |
| 2003/0088600 A1 | 5/2003 | Lao et al. |
| 2008/0089110 A1 | 4/2008 | Robinett et al. |
| 2008/0172385 A1 | 7/2008 | Moutiet |
| 2010/0017450 A1 | 1/2010 | Sun et al. |
| 2011/0051485 A1* | 3/2011 | Chang .................. G11C 15/00 365/49.17 |
| 2015/0170025 A1 | 6/2015 | Wu et al. |

OTHER PUBLICATIONS

International Searching Authority, The International Search Report and the Written Opinion, PCT/US2016/015060, dated Sep. 12, 2016, 10 Pgs.

* cited by examiner

IN SITU TRANSPOSITION

BACKGROUND

An array including non-volatile memory elements (memory cells), such as a crossbar array, may be inherently efficient for parallel signal processing because of a compact integrated structure. For example, such a structure may be used to accurately perform, via Kirchhoff's Current Law, vector-matrix multiplication between input vectors and data values (weights) stored by memory elements in a matrix.

DETAILED DESCRIPTION

To input and/or save data values in memory elements (memory cells) of a memory array may be time consuming. Moreover, performance of some operations, such as transposition of the data values in the memory array, also may be time consuming. For instance, for transposition of data values stored as a matrix of a dot product engine, all of the data values stored by the memory elements of the matrix may have to be rewritten by a repeat of the input and save operations (possibly except for data values stored by memory elements along a diagonal, such as top left to bottom right, of the memory array around which the transposition is rotated). Reading the data values from the memory elements of the same matrix to which the data values will be rewritten may further contribute to complexity of and/or the time taken for transposition of the data values.

Accordingly, the present disclosure relates to in situ transposition of the data values whereby the data values remain stored by the non-volatile memory (NVM) elements to which the data values were originally input and/or saved. As such, the time taken for (latency of) computation and/or transposition operations may be notably reduced.

An example system may include a NVM array, including a plurality of NVM elements, usable in performance of computations. The example system may include an input engine to input a plurality of data values for storage by a corresponding plurality of original NVM elements. The example system may further include a transposition engine to direct performance of the in situ transposition such that the plurality of data values remains stored by the original NVM elements.

Figure 1:
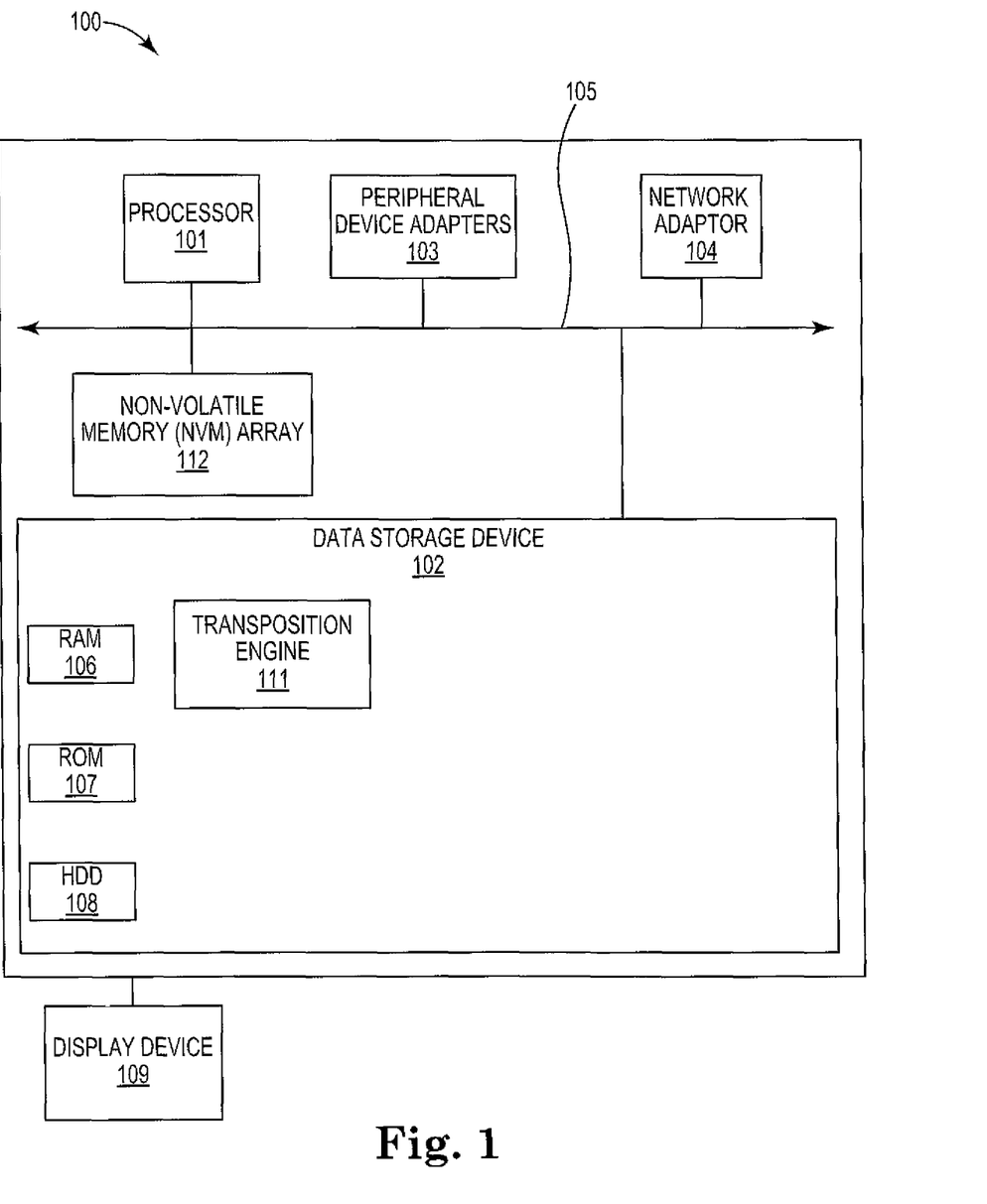
FIG. 1 illustrates a diagram of an example of a computing system for in situ transposition according to the present disclosure.

FIG. 1 is a diagram of a computing system 100 for in situ transposition according to one example of the principles described herein. The computing system 100 may be implemented in an electronic device. Examples of electronic devices include servers, desktop computers, laptop computers, personal digital assistants (PDAs), mobile devices, smartphones, gaming systems, and/or tablets, among other electronic devices that may individually or collectively be termed a "machine" depending on the context.

The computing system 100 may be utilized in any data processing scenario including stand-alone hardware, mobile applications, through a computing network, or combinations thereof. Further, the computing system 100 may be used in a computing network, a public cloud network, a private cloud network, a hybrid cloud network, other forms of networks, or combinations thereof. The systems and methods described herein may be provided by the computing system 100. The systems and methods may be provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The systems presented herein may be implemented on one or multiple hardware platforms, in which the engines and/or modules in the system may be executed on one or across multiple platforms. Such engines and/or modules may run on various forms of cloud technologies and hybrid cloud technologies or be offered as a SaaS (Software as a service) that may be implemented on or off the cloud. In another example, the systems and/or methods provided by the computing system 100 may be executed by a local administrator.

To achieve its intended functionality, the computing system 100 may include various hardware components. Among these hardware components may be a number of processors 101, a number of data storage devices 102, a number of peripheral device adapters 103, and/or a number of network adapters 104. These hardware components may be interconnected through use of a number of busses and/or network connections. For example, the processor 101, data storage device 102, peripheral device adapters 103, and/or a network adapter 104 may be communicatively coupled via a bus 105.

The processor 101 may include the hardware architecture to retrieve executable code from the data storage device 102 and execute the executable code. The executable code may, when executed by the processor 101, cause the processor 101 to implement at least part of the functionality, for example, of an input engine (e.g., as shown at 447 in FIG. 4) by applying a number of first voltages to a corresponding number of, for example, row lines (wires) and/or column lines (wires) within a NVM array 112. In some examples, the NVM array 112 may be a memristive crossbar array in which the voltages applied by the input engine may change the resistive values of a corresponding number of memristors located at junctions between the row wires and a number of column wires. The first voltages may represent a corresponding number of values within a matrix, as described herein.

The executable code may, when executed by the processor 101, also cause the processor 101 to implement at least part of the functionality of the input engine by applying a number of second voltages to a corresponding number of row wires and/or column wires, as described herein, within the NVM array 112. The second voltages may represent a corresponding number of input vector values, as described herein. The executable code may, when executed by the processor 101, further cause the processor 101 to implement at least the functionality of collecting the output currents from the row wires and/or column wires, as described herein. In some examples, the collected output currents may represent a dot product when the NVM array 112 is operated as a dot product engine (DPE). In the course of executing code, the processor 101 may receive input from and and/or provide output to a number of other hardware units.

The data storage device 102 may store data such as executable program code that is executable by the processor 101. In various examples, one, or more processors may collectively be termed a processing resource. The data storage device 102 may specifically store program code (e.g., computer-readable instructions (CRI), machine-readable instructions (MRI), etc.) representing a number of applications that the processor 101 may execute to implement at least the functionality described herein.

The data storage device 102 may include various types of memory modules, including volatile and non-volatile memory. For example, the data storage device 102 of the present example includes random access memory (RAM) 106, read-only memory (ROM) 107, and/or hard disk drive (HDD) memory 108. Many other types of memory also may be utilized, and the present disclosure contemplates the use of as many varying type(s) of memory in the data storage device 102 as may suit a particular application of the principles described herein. In various examples, different types of memory in the data storage device 102 may be used for different data storage needs. For example, in certain examples the processor 101 may boot from ROM 107, maintain non-volatile storage in the HDD memory 108, and/or execute program code stored in RAM 106, among other potential uses of memory types.

The data storage device 102 may include a machine-readable medium (MRM), a machine-readable storage medium (MRSM), and/or a non-transitory MRM, which can include MRI executable by a processing resource of a computing apparatus, among others. For example, the data storage device 102 may be, but is not limited to, an electronic, magnetic, resistive, optical, electromagnetic, infrared, or semiconductor system, apparatus, or device, or any suitable combination of the foregoing. More specific examples of the MRSM may include, for example, the following: an electrical connection having a number of wires, a portable computer diskette, a hard disk, a RAM, a ROM, an erasable programmable ROM (EPROM or Flash memory), a portable compact disc ROM (CD-ROM), an optical storage device, a magnetic storage device, or any suitable combination of the foregoing. In the context of this disclosure, a MRSM may be any tangible medium that can contain, or store machine-usable program code for use by or in connection with an instruction execution system, apparatus, and/or device. In another example, a MRSM may be any non-transitory medium that can contain, or store a program for use by, or in connection with, an instruction execution system, apparatus, and/or device.

The hardware adapters 103, 104 in the computing system 100 may enable the processor 101 to interface with various other hardware elements, external and/or internal to the computing system 100. For example, the peripheral device adapters 103 may provide an interface to input/output devices, such as, for example, display device 109, a mouse, and/or a keyboard (not shown). The peripheral device adapters 103 also may provide access to other external devices, such as an external storage device, a number of network devices such as, for example, servers, switches, and/or routers, client devices, other types of computing devices, and combinations thereof (not shown).

The display device 109 may be provided to allow a user of the computing system 100 to interact with and/or to implement the functionality of the computing system 100. The peripheral device adapters 103 may also create an interface between the processor 101 and the display device 109, a printer, or other media output devices (not shown). The network adapter 104 may provide an interface to other computing devices within, for example, a network, thereby enabling the transmission of data between the computing system 100 and other devices located within the network.

The computing system 100 may, when executed by the processor 101, display the number of graphical user interfaces (GUIs) on the display device 109 associated with the executable program code representing the number of applications stored on the data storage device 102. The GUIs may display, for example, interactive screenshots that allow a user to interact with the computing system 100 to input data values to the NVM array 112 for various computation operations. For example, matrix values and input vector values may, in some embodiments, be stored in and/or input to the NVM array 112 functioning as a DPE for vector/matrix multiplication via the memory elements (e.g., at junctions of a NVM crossbar array). The memory elements in the NVM array may, in some examples, be resistive memory (memristor) elements used in a memristor array, although embodiments are not limited to such memristor arrays. Additionally, via interacting with the GUIs of the display device 109, a user may obtain a dot product value based on input of an input vector. Examples of display devices 109 include a computer screen, a laptop screen, a mobile device screen, a personal digital assistant (PDA) screen, and/or a tablet screen, among other display devices.

The computing system 100 may include various implementations of the NVM array 112. In some examples, the NVM array 112 may be various implementations of a memristive NVM array, as illustrated at 212 in FIG. 2 and at 312 in FIG. 3.

In some examples, the NVM array 112 may include a number of elements, including a number of memristors that function together within the array to perform a weighted sum of multiple inputs. A differential mode DPE memristive array may be used in a number of applications. For example, the differential mode DPE memristive array may be used as a threshold logic gate (TLG) to perform a matrix product to compare the output with a threshold. Thus, the differential mode DPE memristive array may be used as an accelerator in which the differential mode DPE memristive array may perform a number of functions faster than in other implementations of a DPE.

Although the NVM array 112 is depicted as being a device internal to the computing system 100, in another example, the NVM array 112 may be a peripheral device coupled to the computing system 100 or included within a peripheral device coupled to the computing system 100.

The computing system 100 further includes a number of modules used in the implementation of the systems and methods described herein. The various modules within the computing system 100 include executable program code that may be executed separately. In this example, the various modules may be stored as separate program products. In another example, the various modules within the computing system 100 may be combined within a number of program products and each program product may include a number of the modules.

The computing system 100 may include a transposition engine 111 to, for example, when executed by the processor 101, assist in the functionality of the NVM array 112. The transposition engine 111 may assist in the NVM array 112 functionality by directing in situ transposition of a number of data values. For example, the data values may be stored as a matrix by memory elements of the NVM array 112 operating as a DPE to process a dot product mathematical computation. As described further herein, the transposition engine 111 may direct hardware circuitry to perform the in situ transposition such that a row of NVM elements operates as a column of NVM elements and a column of NVM elements operates as a row of NVM elements, although the plurality of data values stored in the matrix of rows and columns remains stored by the original NVM elements.

Figure 2:
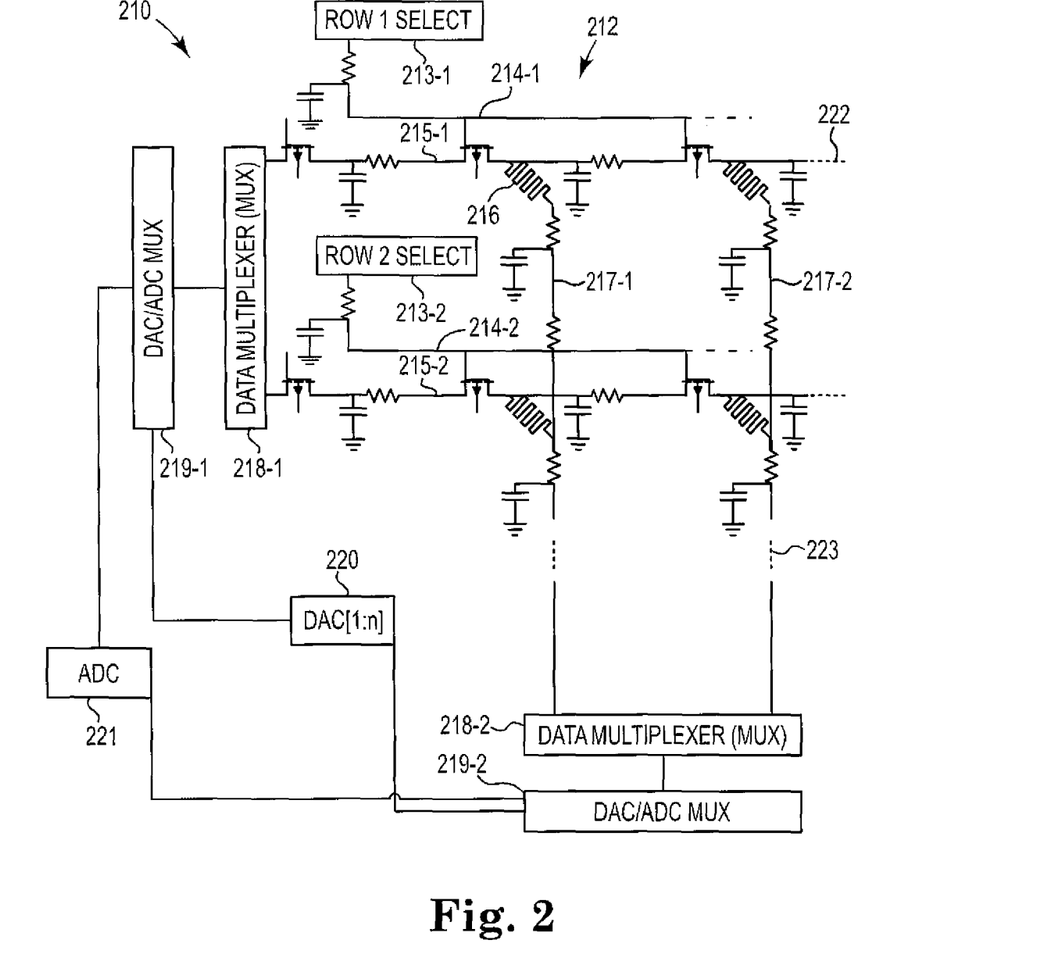
FIG. 2 illustrates a circuit diagram of an example of an array for in situ transposition according to the present disclosure.
Figure 3:
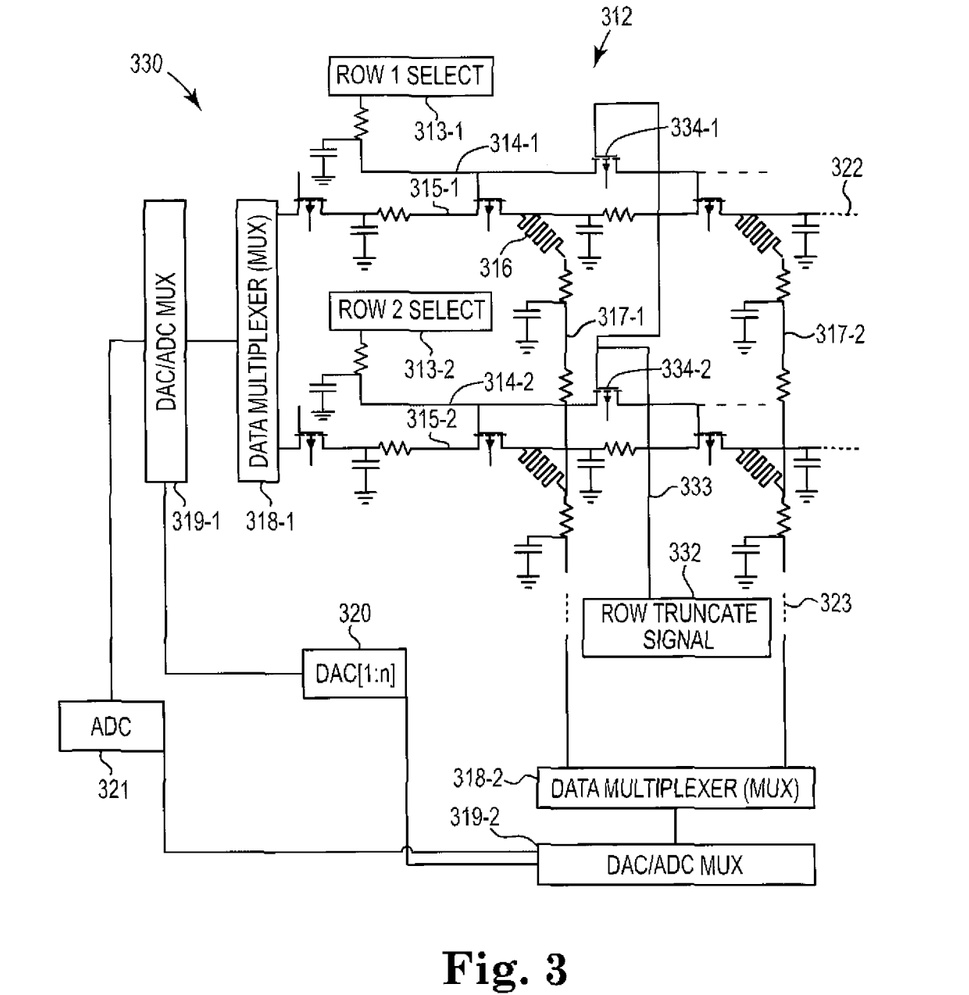
FIG. 3 illustrates a circuit diagram of another example of an array for in situ transposition according to the present disclosure.

FIG. 2 illustrates a circuit diagram of an example of an array for in situ transposition according to the present disclosure. The configurations of the circuit diagrams illustrated in FIGS. 2 and 3 are shown by way of example and not by way of limitation. Positioning, numbers, and/or types of resistors, transistors, etc., may vary between different embodiments and remain within the scope of the present disclosure. The array 210 illustrated in FIG. 2 may be implemented with various types of memory elements and/or be used for various computational purposes within the scope of the present disclosure. The array 210 may include a NVM array 212 that, for example, may be implemented as a DPE with memristor memory elements, as described in connection with the computing system 100 shown in FIG. 1.

The NVM array 212 may include a number of electrically conductive row wires 215 and a number of electrically conductive column wires 217. The row wires 215 and column wires 217 intersect at junctions. A number of NVM elements 216 (e.g., resistive memory devices or "memristors") may be individually located at each of the junctions and electrically couple the row wires 215 to the column wires 217. Even though two row wires 215-1, 215-2, two column wires 217-1, 217-2, and four NVM elements 216 at the junctions thereof are depicted in FIG. 2, any number of row wires 215, column wires 217, and NVM elements 216 may be present in the NVM array 212. For example, any number of row wires 215 and column wires 217 may be included within the memristive NVM array 212 as indicated by the ellipses 222, 223. The number of row wires 215, column wires 217, and NVM elements 216 included within the memristive NVM array 212 may be equal to or greater than the size of the matrix, and the associated NVM elements 216, for a dot product to be calculated using the memristive NVM array 212 in connection with the systems and methods described herein.

"Memristance" is a property of an example of an electronic component referred to as a resistive memory element. Such a resistive memory element may be termed a memristor. The memristor is a resistor device whose resistance can be changed. For example, if charge flows in one direction through a circuit, the resistance of a memristor component of the circuit may increase. In contrast, if charge flows in the opposite direction in the circuit, the resistance of the memristor component may decrease. If the flow of charge is stopped by turning off the applied voltage, the memristor component will "remember" the last resistance that it had, and when the flow of charge starts again the resistance of the circuit will be what it was when it was last active. In this manner, the memristors are "memory resistors". As such, a memristor is an example of a NVM element, although the NVM arrays and NVM elements described herein are not limited to using memristors.

Conductance channels (e.g., filaments) in the memristors 216 may be formed in each of the memristors 216 and the memristors 216 may be individually addressed as bits. A NVM array 212 may be formed as a crossbar array of switches that connect each wire in one set of parallel row wires 215 to every member of a second set of parallel column wires 217 that intersects the first set 215 at junctions at which the memristors 216 are formed. In the example of FIG. 2, the row wires 215 and the column wires 217 are perpendicular with respect to each other, although the row wires 215 and the column wires 217 may intersect at any angle.

The memristors 216 may be formed at the micro- or nanoscale and may be used as NVM element components in a wide variety of electronic circuits, such as, bases for memory and/or logic circuits and arrays. When used as memory, the memristors 216 may be used to store a bit of information (e.g., 1 or 0 in binary). When used as a logic circuit, the memristors 216 may be employed to represent bits in a field programmable gate array as the basis for a wired-logic programmable logic array, or, as described herein, as a DPE. The memristors 216 disclosed herein may also find use in a wide variety of other applications. The memristors 216 may be fabricated through any suitable fabrication process, for example, by chemical vapor deposition, sputtering, etching, lithography, and/or other suitable methods of fabricating memristors.

The memristive NVM array 212 shown in FIG. 2 may be used for data values to be stored by the memristors 216. The data values may be program signals used to change the resistance values at each individual memristor 216 at positions of the memristive NVM array 212 to create a representation (e.g., a mapping) of a mathematic matrix in which each data value (e.g., a data value representing a digit) stored by a memristor 216 at each position represents a data value within the matrix. As described herein, the data values may be input by the processor 101 and/or the input engine 447. In various examples, NVM arrays, NVM elements, and/or matrices therein may be formed as two dimensional or three dimensional structures. The change in resistance among the individual memristors 216 is an analog change from a low-to-high value or a high-to-low value. The change in the resistance value may correspond to an inverse of a change of a conductance value.

The input data values may also be read signals used to read the resistance values at each individual memristor 216 at each junction in the memristive NVM array 212, and/or as data values of an input vector to be multiplied by a stored matrix value at each memristor 216 involved in the calculation. The signals referred to herein as a input vector signals may be applied as second data values input to the row wires 215 and/or column wires 217 of the memristive NVM array 212, as described herein. The input vector signals may represent data values to be multiplied by the data values stored by the memristors 216 of the matrix.

The input data values used as read signals have a relatively lower voltage value than the first voltages used to program the memristors 216 such that the voltage level applied by the input signals does not change the resistance values of the memristors 216 as programmed by the first voltages. The input signals may act as read signals in this manner by not changing the resistance values of the memristors 216. An initial signal may, for example, be applied to the memristors 216 before application of the program signals, read signals, and/or input vector signals in order to set the resistivity (conductivity) of the memristors 216 to a known value.

A multiplexer is a device that may select one of several analog or digital input signals and forward selected input into a single line. A multiplexer of $2^n$ inputs may have n select lines, which may be used to select which input line(s) to connect to which output line(s). For simplicity, FIGS. 2 and 3 do not show all the input, output, and/or select lines. A multiplexer may enable several signals to share one device or resource, for example, one analog to digital converter (ADC) or one communication line, instead of having one device per signal.

As a result of the transposition described herein, the array 210 may enable input vector signals to be input via a data multiplexer (mux) 218-1 selectably coupled to each of the row wires 215 of the matrix in the NVM array 212. Alternatively, the array 210 may enable input vector signals to be input via a data mux 218-2 selectably coupled to each of the column wires 217 of the matrix. Regardless of whether the input vector signals are input via the data mux 218-1 to the row wires 215 or via the data mux 218-2 to the column wires 217, the input vector signals interact with the data values as originally stored by the memristors 216 at their respective positions (junctions) in the matrix. However, inputting the input vector signals to the column wires 217 may transpose the orientation of the data values as originally stored in the matrix relative to inputting the input vector signals to the row wires 215.

As a result, the resulting current (e.g., representing a dot product) may be collected via the data mux 218-2 when, for example, a vector signal is input to row wire 215-1 and output from, for example, either column wire 217-1 or 217-2. A row 1 select signal 213-1 may, for example, be applied to row 1 select line 214-1 and a row 2 select signal 213-2 may be applied to row 2 select line 214-2 as a row select signal path to determine whether the memristors 216 connected to column wire 217-1 and/or connected to column wire 217-2, and also connected to row wires 215-1 and 215-2, perform the dot product multiplication. Alternatively, the resulting current may be collected via the data mux 218-1 when a vector signal is input to column wire 217-1 and output from either row wire 215-1 or 215-2.

For example, both row 1 select line 214-1 and row 2 select line 214-2 may be enabled such that input voltage gets applied to both row wire 215-1 and row wire 215-2. This may result in current flowing in both column 217-1 and column 217-2. In an example in which there is one ADC for each column, data mux 218-2 may not be utilized. Instead, a control (or select) signal may be applied to DAC/ADC mux 219-2, as described below, so that current is directed to the appropriate ADCs. However, when there fewer ADCs, for example when there is one ADC being shared by both columns in FIG. 2, the ADC may be selected instead of a digital to analog converter (DAC) through DAC/ADC mux 219-2 and the columns 217-1, 217-2 may be selected one by one through data mux 218-2. By applying the appropriate select (or control) signal to data mux 218-2, dot-product current may be output from either column 217-1 or column 217-2.

As such, in some examples, each row 215-1, 215-2 may have a dedicated DAC (or each column 217-1, 217-2 may have a DAC in a transpose mode, as described herein). However, in some examples, an ADC may be shared (multiplexed) by more than one column (or row when in the transpose mode).

When v1 is a voltage applied to row wire 215-1 and v2 the voltage applied to the row wire 215-2, the current flowing in the NVM elements 216 may be represented as $v1*g11$, $v1*g12$, $v2*g21$, and $v2*g22$ where the g values indicate the conductance of the two NVM elements 216 shown for each row wire 215-1, 215-2. The current in column 217-1 may be represented as $v1*g11+v2*g21$ and the current in column 217-1 may be represented as $v1*g12+v2*g22$. Actual current may vary slightly based on parasitic, data pattern, and/or cell location factors.

FIG. 2 illustrates that the array 210 may include a DAC resource 220 and an ADC resource 221. The data mux 218-1 for the row wires 215 may be selectably coupled to a first DAC/ADC mux 219-1 and the column wires 217 may be selectably coupled to a second DAC/ADC mux 219-2. For example, the first DAC/ADC mux 219-1 may be selectably coupled to the row wires 215 of the NVM array 212 via the first data mux 218-1 and the second DAC/ADC mux 219-2 may be selectably coupled to the column wires 217 of the NVM array 212 via the second data mux 219-2. The first DAC/ADC mux 219-1 may selectably couple the row wires 215 of the NVM array 212 to one of the DAC resource 220 and the ADC resource 221 and the second DAC/ADC mux 219-2 may selectably couple column wires 217 of the NVM array 212 to the other one of the DAC resource 220 and the ADC resource 221.

For example, the transposition engine 111 may direct (e.g., by sending a signal) and, in response, the first DAC/ADC mux 219-1 for the row wires 215 may decouple from the DAC resource 220 and couple to the ADC resource 221. In addition, the second DAC/ADC mux 219-2 for the column wires 217 may decouple from the ADC resource 221 and couple to the DAC resource 220. Recoupling the DAC resource 220 and the ADC resource 221 as such may enable inputting the input vector signals to the column wires 217 to transpose the orientation of the data values as originally stored in the matrix relative to inputting the input vector signals to the row wires 215. Such a reorientation of the coupling the DAC resource 220 and the ADC resource 221 (e.g., for a DPE) may be contrary to coupling of DAC devices and ADC devices in other implementations.

In some examples, the DAC resource 220 may include a plurality of DAC devices that corresponds to a plurality of physical rows and/or columns in the NVM array. For example, each row wire 215 and/or column wire 217 in the NVM array 212 (e.g., in the matrix) may be selectably coupled to one DAC device, which may be a dedicated DAC device of the plurality of DAC devices, in the DAC resource 220 that corresponds to the number of row wires 215 and/or column wires 217. As such, for example, the first DAC/ADC mux 219-1 for the row wires 215 may couple DAC devices [1:n] to the row wires 215 and the DAC/ADC mux 219-1 may establish 1:1 connections between DAC device [1] and row wire 215-1 through DAC device [n] and row wire 215-n.

The ADC resource 221 may, in some examples, include at least one ADC device that is time multiplexable by a subset of the plurality of physical rows and columns in the NVM array such that a number of ADC devices may be less than the plurality of physical rows or columns. The second data mux 218-2 for the column wires 217 may, for example, couple the ADC resource 221 to one of a plurality (n) of column wires 217 at a time as an n-bit ADC device, where n may define a degree of column multiplexing. In the transpose mode, the ADC resource 221 may be coupled to one of the n row wires 215 at a time. The second data mux 218-2 for the column wires 217 may couple to the ADC resource 221 and the second data mux 218-2 may decouple the DAC resource 220, or vice versa. In some examples, the second data mux 218-2 may couple to the ADC resource 221 and the second DAC/ADC mux 219-2 for the column wires 217 may decouple the DAC resource 220.

The number of ADC devices included in the ADC resource 221 may be a function of the degree of column wire and/or row wire multiplexing. For instance, high speed ADC devices may be utilized such that they may be time multiplexed (e.g., sequentially) to be shared across a plurality of column wires or row wires.

FIG. 3 illustrates a circuit diagram of another example of an array for in situ transposition according to the present disclosure. The array 330 illustrated in FIG. 3 may be implemented with various types of memory elements and/or be used for various computational purposes within the scope of the present disclosure. The array 330 may include a NVM array 312 that, for example, may be implemented as a DPE with memristor memory elements, as described in connection with the computing system 100 shown in FIG. 1 and/or the array 210 shown in FIG. 2.

Arrays, for example in some implementations of DPEs, may operate by activating all the memory elements in the array substantially simultaneously. In some situations, such as to reduce power consumption and/or to reduce mapping complexity, among other reasons, it may be desirable to activate, access, and/or operate a subset of rows and/or columns of memory elements at a time. Hence, FIG. 3 illustrates how the row select signal path shown at 213 and 214 in FIG. 2 may be modified.

Accordingly, FIG. 3 illustrates truncate transistors 334-1, 334-2 connected to the row select lines 314-1, 314-2, respectively, to isolate column wires. In the example shown in FIG. 3, column wire 317-1 can be isolated from column wire 317-2, although truncate transistors may be positioned at any position along the row select lines 314-1, 314-2 suitable for isolation of any number of columns that intersect the row wires 315 and/or row select lines 314. In some examples, the truncate transistors 334 may be designed with a smaller electrical load handling capability than that of, for example, the NVM elements 316 (e.g., memristors) because the truncate transistors 334 may handle a smaller current.

In some examples, a truncate engine (not shown) may send a row truncate signal 332. In some examples, the truncate engine may be part of or associated with the input engine 447 and/or the transposition engine 111, 411, although other configurations are within the scope of the present disclosure. A truncate transistor 344 associated with a row select wire 314 at a particular location may disable, based on receipt of the truncate signal 332, a row signaling path 313, 314 at the particular location. By disabling the row signaling path at the particular location, a column of NVM elements intersected by a row of NVM elements may be isolated in order to reduce activation of, access to, and/or operation of the NVM elements to a subset of the columns of the NVM array. Disabling the row signaling path 313, 314 at truncate transistors 334-1, 334-2 may, in various examples, result in isolation of activation of, access to, and/or operation of the NVM elements 316 in columns either to the left of or to the right of the truncate transistors 334-1, 334-2.

Figure 4:
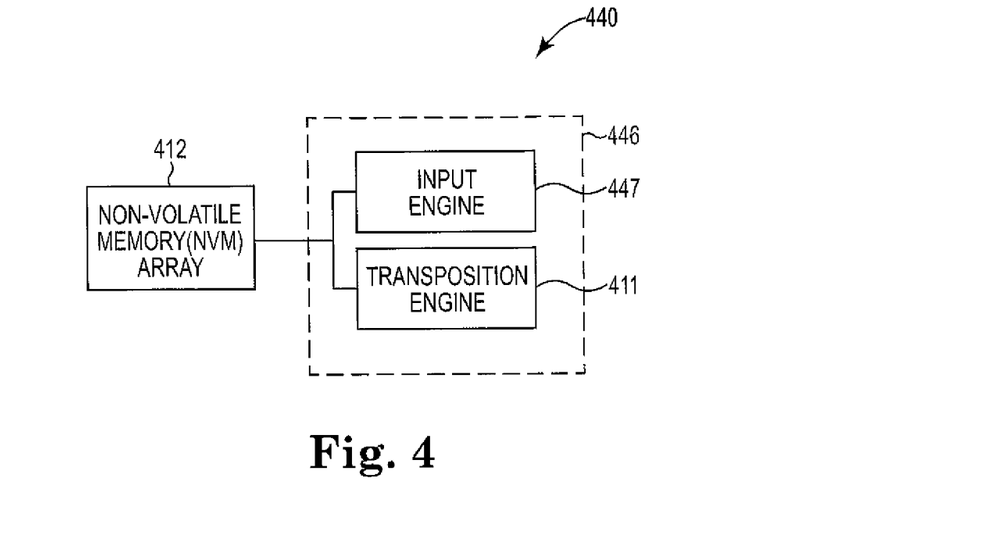
FIG. 4 illustrates a diagram of an example of a system for in situ transposition according to the present disclosure.

FIG. 4 illustrates a diagram of an example of a system for in situ transposition according to the present disclosure. The system 440 may include a combination of a NVM array 412 (e.g., as described in connection with FIGS. 1-3, etc.), and a number of engines 446 to enable execution of particular tasks 447, 411. The system 440 may be in communication with the NVM array 412 via a communication link, and may include the number of engines (e.g., input engine 447, transposition engine 411, etc.). The system 440 may include additional or fewer engines than illustrated to perform the various tasks described herein. The system 440 may represent programmed instructions and/or hardware.

The number of engines may include a combination of hardware and instructions (e.g., programming) to perform a number of tasks described herein (e.g., to contribute to transposition of data values in the NVM array 412, etc.). The instructions may be executable by a processing resource and stored in a non-transitory memory resource (e.g., computer-readable medium (CRM), MRM, etc.), or may be hard-wired in hardware (e.g., logic).

As described herein, the system 440 may include the NVM array 412 that includes a plurality of NVM elements 216, where a NVM element may be located, for example, at each junction of the NVM array 412. The NVM array 412 is usable in performance of various types of computations. For example, the NVM array 412 may be used as a DPE for vector-matrix multiplication, among other computations suitable for a NVM array.

The input engine 447 may include hardware and/or a combination of hardware and instructions (e.g., programming) to input a plurality of data values for storage by a corresponding plurality of original NVM elements. As described herein, the input engine 447 may input the plurality of data values for storage at original positions of, for example, a two dimensional matrix of the corresponding plurality of the original NVM elements. In some examples, the input engine 447 may operate in cooperation with the processor 101 described in connection with FIG. 1.

The transposition engine 411 may include hardware and/or a combination of hardware and instructions (e.g., programming) to direct performance of in situ transposition such that the plurality of data values remains stored by the original NVM elements to which the data values were originally input. As described herein, the transposition engine 411 may direct selectable coupling of a DAC resource 220 and an ADC resource 221, where the selectable coupling may perform the in situ transposition by a row of NVM elements operating as a column and a column of NVM elements operating as a row. Hence, the transposition engine may direct performance of the in situ transposition such that the plurality of data values remains stored at the original positions. For example, the data values may remain stored at the original positions in a matrix to which the data values were input by the input engine 447.

Figure 5:
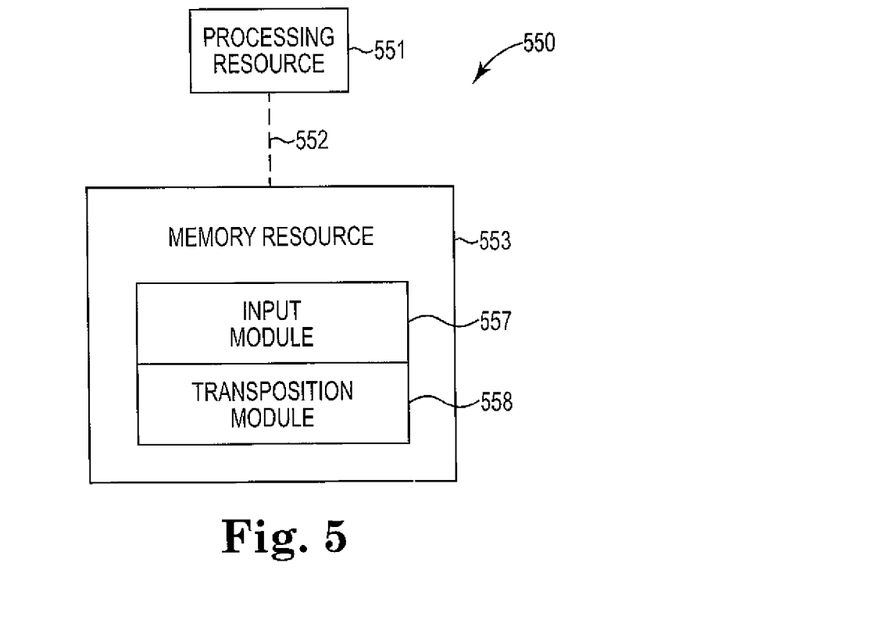
FIG. 5 illustrates a diagram of an example computing device for in situ transposition according to the present disclosure.

FIG. 5 illustrates a diagram of an example computing device for in situ transposition according to the present disclosure. The computing device 550 may utilize programmed instructions, hardware, hardware with instructions, and/or logic to perform a number of tasks described herein. The computing device 550 may include additional or fewer modules than illustrated to execute the various tasks described herein.

The computing device 550 may be any combination of hardware and program instructions to share information. The hardware, for example, may include a processing resource 551 and/or a memory resource 553 (e.g., CRM, MRM, database, etc.) The processing resource 551, as used herein, may include any number of processors capable of executing instructions stored by the memory resource 553. The processing resource 551 may be integrated in a single device or distributed across multiple devices. The program instructions (e.g., CRI, MRI, etc.) may include instructions stored on the memory resource 553 and executable by the processing resource 551 to implement a desired task (e.g., to contribute to transposition of data values in the NVM array 412, etc.).

The memory resource 553 may be in communication with the processing resource 551. The memory resource 553, as used herein, may include any number of memory components capable of storing instructions that may be executed by the processing resource 551. Such a memory resource 553 may be a non-transitory CRM or MRM. The memory resource 553 may be integrated in a single device or distributed across multiple devices. Further, the memory resource 553 may be fully or partially integrated in the same device as the processing resource 551 or it may be separate but accessible to that device and processing resource 551. Thus, the computing device 550 may be implemented on a participant device, on a server device, on a collection of server devices, and/or on a combination of the user device and the server device.

The memory resource 553 may be in communication with the processing resource 551 via a communication link (e.g., path) 552. The communication link 552 may be local or remote to a machine (e.g., a computing device) associated with the processing resource 551. Examples of a local communication link 552 may include an electronic bus internal to a machine (e.g., a computing device) where the memory resource 553 is at least one of volatile, non-volatile, fixed, and/or removable storage medium in communication with the processing resource 551 via the electronic bus.

A number of modules 557, 558 may include MRI that when executed by the processing resource 551 may perform a number of tasks. The number of modules 557, 558 may be sub-modules of other modules. For example, the input module may be a sub-module of the transposition module 558 and/or contained within the same computing device. In another example, the number of modules 557, 558 may comprise individual modules at separate and distinct locations (e.g., CRM, MRM, etc.).

Each of the number of modules 557, 558 may include instructions that when executed by the processing resource 551 may function as a corresponding engine, as described herein. For example, the input module 557 may include instructions that when executed by the processing resource 551 may function as the input engine 447. In another example, transposition module 558 may include instructions that when executed by the processing resource 551 may function as the transposition engine 411.

The input module 557 may include MRI that, when executed by the processing resource 551, may perform a number of tasks. For example, the input module 557 may input a plurality of data values for storage at original positions of a two dimensional matrix of a corresponding plurality of NVM elements of an NVM array, as described in connection with the input engine 447. The input module 557 may include further MRI that when executed by the processing resource 551 may perform input of an input vector pattern to determined positions (e.g., original positions) of a matrix in the NVM array 412 for operation as a DPE.

The transposition module 558 may include MRI that when executed by the processing resource 551 may perform a number of tasks. For example, the transposition module 558 may be used, as described herein, to selectably couple, via a first DAC/ADC mux 219-1, row wires 215 of the NVM array 412 to one of a DAC resource 220 and an ADC resource 221. The transposition module 558 also may be used to selectably couple, via a second DAC/ADC mux 219-2, column wires 217 of the NVM array 412 to the other one of the DAC resource 220 and the ADC resource 221, as described in connection with the transposition engine 411.

In some examples, the transposition module 558 may be used to decouple, via the first DAC/ADC mux 219-1, a coupled DAC resource 220 from a row wire 215 and couple the ADC resource 221 to the row wire 215 for the in situ transposition, or vice versa. The transposition module 558 also may be used to decouple, via the second DAC/ADC mux 219-2, a coupled ADC resource 221 from a column wire 217 and couple the DAC resource 220 to the column wire 217 for the in situ transposition, or vice versa.

Accordingly, the transposition module 558 may be used to perform in situ transposition of the plurality of data values by the selectably coupled DAC and ADC resources enabling rows of the NVM elements to operate as columns and columns of NVM elements to operate as rows. The plurality of data values may remain stored at the original positions, for example, of the two dimensional matrix.

Figure 6:
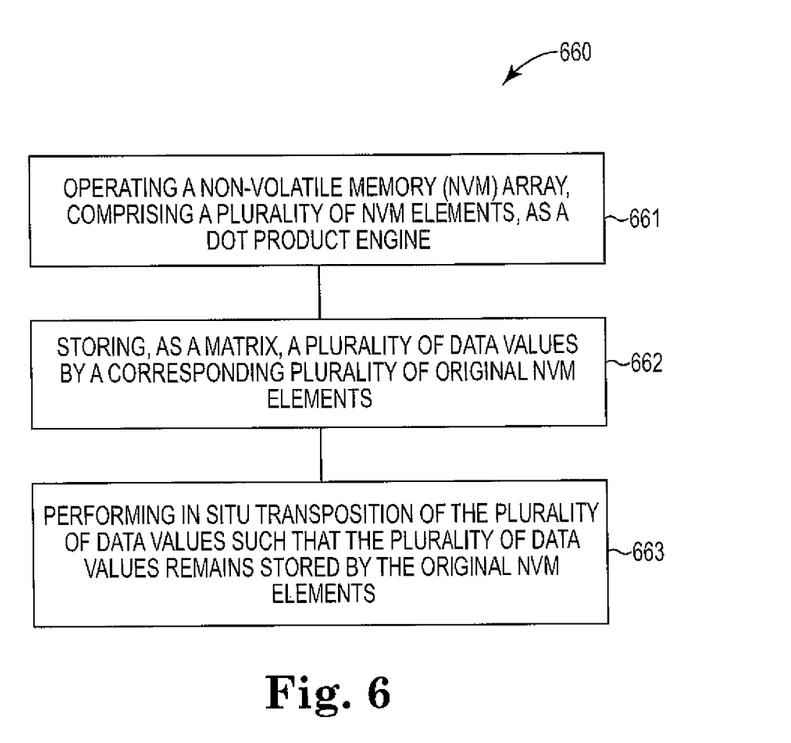
FIG. 6 illustrates a flow diagram of an example method for in situ transposition according to the present disclosure.

FIG. 6 illustrates a flow diagram of an example method for in situ transposition according to the present disclosure. Unless explicitly stated, the method examples described herein are not constrained to a particular order or sequence. Additionally, some of the described method examples, or elements thereof, may be performed at the same, or substantially the same, point in time. As described herein, the actions, tasks, functions, calculations, data manipulations and/or storage, etc., may be performed by execution of non-transitory MRI stored in a number of memories (e.g., programmed instructions, hardware with instructions, hardware, and/or logic, etc.) of a number of applications. As such, a number of computing resources with a number of interfaces (e.g., user interfaces) may be utilized for implementing the methods described herein (e.g., via accessing a number of computing resources via the user interfaces).

The present disclosure describes a method 660 for operating a NVM array 212, including a plurality of NVM elements 216, as a DPE, as shown at 661 in FIG. 6. At 662, the method may include storing, as a matrix, a plurality of data values by a corresponding plurality of original NVM elements. At 663, the method may include performing in situ transposition of the plurality of data values such that the plurality of data values remains stored by the original NVM elements.

In some examples, the method may include performing vector-matrix multiplication between an input vector and the plurality of transposed data values stored as the matrix by the original NVM elements. For example, the vector-matrix multiplication may be performed by input of the data values of the input vector via the column wires 217 for multiplication by the data values stored in the matrix whose positions are transposed as a result of not inputting the data values of the input vector via the row wires 215.

In some examples, the method can include operating the NVM array 212 as a plurality of DPEs. For example, an input vector may be a multibit vector that has a size of 8 bits. As such, the input vector may be input by a plurality of 8 bit DAC devices, with each one of the respective plurality coupled to an individual row of a single DPE, where each 8 bit DAC device provides 128 different voltage levels to be input to the matrix of the single DPE. In some examples, the method can include inputting a multibit input vector to a row wire 215 of the DPE via the DAC resource 220 having a corresponding multibit DAC device selectably coupled to the row wire 215.

In contrast, 8 DPEs may be linked in parallel with each DPE handling only one bit of the elements in the multibit input vector. Hence, a multibit input vector may be input to the plurality of DPEs as one bit per DPE such that the plurality of DPEs corresponds to the number of bits in the multibit input vector. As such, when an input vector is one bit in size (e.g., 0 or 1 in binary), for example, by being input as VDD or 0V, among other voltage possibilities, or by a multibit input vector being split into single bit elements, the single bit input vector may be input to the matrix without using a DAC device. Accordingly, in some examples, the method can include inputting a single bit input vector directly to the row wire 215 or the column wire 217 of the DPE without using the DAC resource 220.

As used herein, "a" or "a number of" something may refer to one or more such things. For example, "a number of widgets" may refer to one or more widgets. Also, as used herein, "a plurality of" something may refer to more than one of such things.

As used herein, "logic" is an alternative or additional processing resource to perform a particular action and/or function, etc., described herein. Logic includes hardware (e.g., various forms of transistor logic, application specific integrated circuits (ASICs), etc.), as opposed to machine-executable instructions (e.g., programmed instructions, hardware with instructions, etc.) stored in memory and executable by a processor.

The figures herein follow a numbering convention in which the first digit corresponds to the drawing figure number and the remaining digits identify an element or component in the drawing. For example, 114 may reference element "14" in FIG. 1, and a similar element may be referenced as 214 in FIG. 2. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

In the present disclosure, reference is made to the accompanying drawings that form a part hereof, and in which is shown by way of illustration how a number of examples of the disclosure may be practiced. These examples are described in sufficient detail to enable those of ordinary skill in the art to practice the examples of this disclosure, and it is to be understood that other examples may be used and that process, computational, electrical, and/or structural changes may be made without departing from the scope of the disclosure.

The specification examples provide a description of the applications and use of the system and method of the present disclosure. Since many examples may be made without departing from the spirit and scope of the system and method of the present disclosure, this specification sets forth some of the many possible example configurations and implementations.

What is claimed is:

1. A system, comprising:
a non-volatile memory (NVM) array, comprising a plurality of NVM elements, usable in performance of computations;
an input engine to input a plurality of data values for storage by a corresponding plurality of original NVM elements; and
a transposition engine to direct performance of in situ transposition such that the plurality of data values remains stored by the original NVM elements wherein:
the transposition engine directs selectable coupling of a digital to analog converter (DAC) resource and an analog to digital converter (ADC) resource; and
the selectable coupling performs the in situ transposition by a row of NVM elements operating as a column and a column of NVM elements operating as a row.

2. The system of claim 1, wherein:
the input engine inputs the plurality of data values for storage at original positions of a two dimensional matrix of the corresponding plurality of the original NVM elements; and
the transposition engine directs performance of the in situ transposition such that the plurality of data values remains stored at the original positions.

3. The system of claim 1, wherein at least one NVM element is a resistive memory element.

4. The system of claim 1, wherein the NVM array is a dot product engine (DPE) to store the input plurality of data values as a matrix.

5. The system of claim 1, wherein the system further comprises:
a truncate engine to send a truncate signal; and
a truncate transistor associated with a row select wire at a particular location to disable, based on receipt of the truncate signal, a row signaling path at the particular location; and
wherein to disable the row signaling path at the particular location isolates a column of NVM elements intersected by a row of NVM elements to reduce activation of NVM elements to a subset of columns of the NVM array.

6. A non-transitory machine-readable medium storing instructions executable by a processing resource to:
input a plurality of data values for storage at original positions of a two dimensional matrix of a corresponding plurality of non-volatile memory (NVM) elements of an NVM array;
selectably couple, via a first DAC/ADC multiplexer, row wires of the NVM array to one of a digital to analog converter (DAC) resource and an analog to digital converter (ADC) resource;
selectably couple, via a second DAC/ADC multiplexer, column wires of the NVM array to the other one of the DAC resource and the ADC resource; and
perform in situ transposition of the plurality of data values by the selectably coupled DAC and ADC resources enabling rows of the NVM elements to operate as columns and columns of NVM elements to operate as rows; and
wherein the plurality of data values remains stored at the original positions of the two dimensional matrix.

7. The medium of claim 6, the instructions further executable to:
decouple, via the first DAC/ADC multiplexer, a coupled DAC resource from a row wire and couple the ADC resource to the row wire for the in situ transposition; and
decouple, via the second DAC/ADC multiplexer, a coupled ADC resource from a column wire and couple the DAC resource to the column wire for the in situ transposition.

8. A method, comprising:
operating a non-volatile memory (NVM) array, comprising a plurality of NVM elements, as a plurality of dot product engines (DPEs);
storing, as a matrix, a plurality of data values by a corresponding plurality of original NVM elements;

performing in situ transposition of the plurality of data values such that the plurality of data values remains stored by the original NVM elements;

inputting a multibit input vector to the plurality of DPEs as one bit per DPE; and wherein the plurality of DPEs corresponds to the number of bits in the multibit input vector.

9. The method of claim 8, further comprising:

performing vector-matrix multiplication between the multibit input vector and the plurality of transposed data values stored as the matrix by the original NVM elements.

10. A system, comprising:

a non-volatile memory (NVM) array, comprising a plurality of NVM elements, usable in performance of computations;

an input engine to input a plurality of data values for storage by a corresponding plurality of original NVM elements;

a transposition engine to direct performance of in situ transposition such that the plurality of data values remains stored by the original NVM elements a digital to analog converter (DAC) resource;

an analog to digital converter (ADC) resource;

a first DAC/ADC multiplexer to selectably couple row wires of the NVM array to one of the DAC resource and the ADC resource; and a second DAC/ADC multiplexer to selectably couple column wires of the NVM array to the other one of the DAC resource and the ADC resource.

11. The system of claim 10, wherein at least one NVM element is a resistive memory element.

12. The system of claim 10, wherein the NVM array is a dot product engine (DPE) to store the input plurality of data values as a matrix.

13. The system of claim 10, wherein:

the first DAC/ADC multiplexer is selectably coupled to the row wires of the NVM array via a first data multiplexer; and the second DAC/ADC multiplexer is selectably coupled to the column wires of the NVM array via a second data multiplexer.

14. The system of claim 10, wherein:

the DAC resource comprises a plurality of DACs that corresponds to a plurality of physical rows or columns in the NVM array; and the ADC resource comprises at least one ADC that is time multiplexable by a subset of the plurality of physical rows and columns in the NVM array such that a number of ADCs is less than the plurality of physical rows or columns.

15. A method, comprising:

operating a non-volatile memory (NVM) array, comprising a plurality of NVM elements, as a plurality of dot product engines (DPEs);

storing, as a matrix, a plurality of data values by a corresponding plurality of original NVM elements;

performing in situ transposition of the plurality of data values such that the plurality of data values remains stored by the original NVM elements;

inputting a multibit input vector to a row wire of the DPE via a digital to analog converter (DAC) resource having a corresponding multibit DAC selectably coupled to the row wire; and inputting a single bit input vector directly to the row wire of the DPE without using the DAC resource.

* * * * *